(12) United States Patent
Birnstock et al.

(10) Patent No.: US 7,417,371 B2
(45) Date of Patent: Aug. 26, 2008

(54) ORGANIC ELECTROLUMINESCENT DEVICE AND THE PRODUCTION THEREOF

(75) Inventors: Jan Birnstock, Dresden (DE); Joerg Blaessing, Oberkochen (DE); Karsten Heuser, Erlangen (DE); Matthias Stoessel, Mannheim (DE); Georg Wittmann, Herzogenaurach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/483,520

(22) PCT Filed: Jul. 3, 2002

(86) PCT No.: PCT/DE02/02429

§ 371 (c)(1),
(2), (4) Date: Jan. 9, 2004

(87) PCT Pub. No.: WO03/007378

PCT Pub. Date: Jan. 23, 2003

(65) Prior Publication Data

US 2004/0207316 A1 Oct. 21, 2004

(30) Foreign Application Priority Data

Jul. 11, 2001 (DE) .............................. 101 33 686

(51) Int. Cl.
*H05B 33/22* (2006.01)

(52) U.S. Cl. ...................................... 313/506; 313/504

(58) Field of Classification Search ......... 313/498–512; 257/59, 347, 690, 917; 427/66; 345/44, 345/45, 76, 36; 315/169.3
See application file for complete search history.

(56) References Cited

U.S. PATENT DOCUMENTS

| 5,359,260 | A | | 10/1994 | Rawlings et al. |
| 5,701,055 | A | * | 12/1997 | Nagayama et al. .......... 313/504 |
| 5,773,931 | A | | 6/1998 | Shi et al. |
| 5,836,797 | A | * | 11/1998 | Suzuki et al. .................. 445/24 |
| 6,037,712 | A | | 3/2000 | Codama et al. |
| 6,069,443 | A | | 5/2000 | Jones et al. |
| 6,140,766 | A | | 10/2000 | Okada et al. |
| 6,191,764 | B1 | | 2/2001 | Kono et al. |

(Continued)

FOREIGN PATENT DOCUMENTS

DE 19918193 A1 4/1999

(Continued)

OTHER PUBLICATIONS

Tang, C.W. et al., "Organic electroluminescent diodes", Applied Physics Letters Vo. 51, No. 12, Sep. 21, 1987, pp. 913-915.

(Continued)

*Primary Examiner*—Karabi Guharay
*Assistant Examiner*—Christopher M. Raabe
(74) *Attorney, Agent, or Firm*—Fish & Richardson P.C.

(57) ABSTRACT

The invention describes a passive-matrix powered display with structured pixels and a structured second electrode based on electroluminescent polymers with the following characteristics: functional polymer coatings, which contact a first electrode, are enclosed by windows of an insulating window coating, at least one additional insulating striped coating, which is located between the windows of the first insulating coating, is located across from the first electrode strips as a partition, a second electrode that contacts the functional coatings is structured through partitions and runs across toward the first electrode strips between the partitions.

24 Claims, 7 Drawing Sheets

U.S. PATENT DOCUMENTS

| | | |
|---|---|---|
| 6,249,084 B1 | 6/2001 | Yamana |
| 6,348,359 B1 * | 2/2002 | Van Slyke et al. ............. 438/29 |
| 6,582,888 B1 | 6/2003 | Herbst et al. |
| 6,611,095 B2 * | 8/2003 | Kim .......................... 313/505 |
| 6,656,611 B2 | 12/2003 | Tai et al. |
| 6,811,808 B2 | 11/2004 | Ohshita et al. |
| 6,939,732 B2 | 9/2005 | Birnstock et al. |
| 2001/0035393 A1 | 11/2001 | Lu et al. |
| 2001/0035714 A1 | 11/2001 | Lu |
| 2001/0054868 A1 | 12/2001 | Okuyama et al. |
| 2004/0169464 A1 | 9/2004 | Birnstock et al. |

FOREIGN PATENT DOCUMENTS

| | | |
|---|---|---|
| EP | 0732868 A1 | 9/1996 |
| EP | 0767599 A2 | 4/1997 |
| EP | 0892028 A2 | 1/1999 |
| EP | 0910128 A2 | 4/1999 |
| EP | 0951 073 A2 | 10/1999 |
| EP | 0996314 A1 | 4/2000 |
| EP | 0732868 B1 | 5/2000 |
| EP | 1107335 A2 | 6/2001 |
| EP | 1168448 A2 | 1/2002 |
| JP | 09330792 | 12/1997 |
| JP | 11339958 A | 12/1999 |
| JP | 2000021567 A | 1/2000 |
| JP | 2000294371 A | 10/2000 |
| WO | WO 01/39272 A1 | 5/2001 |
| WO | WO 01/41229 A1 | 6/2001 |

OTHER PUBLICATIONS

Nagayama, K. et al., "Micropatterning Method for the Cathode of the Organic Electroluminescent Device", Jpn. J. Appl. Phys. vol. 36, Part 2, No. 11B, L1555-L1557, Nov. 15, 1997.

Burroughs, J.H. et al., "Light-emitting diodes based on conjugated polymers", Nature vol. 347, Oct 11, 1990, pp. 539-541.

U.S. Appl. No. 10/483,144, Non-Final Office Action mailed Sep. 19, 2007.

U.S. Appl. No. 10/483,144, Non-Final Office Action mailed Jul. 10, 2006.

* cited by examiner

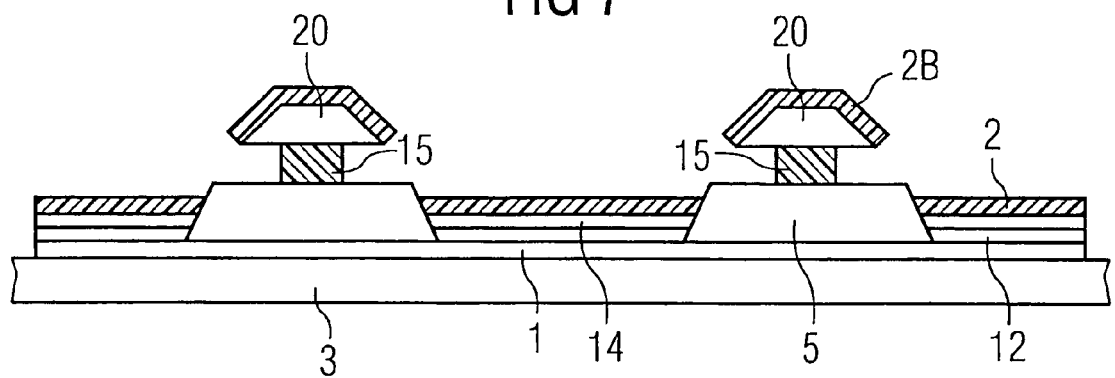
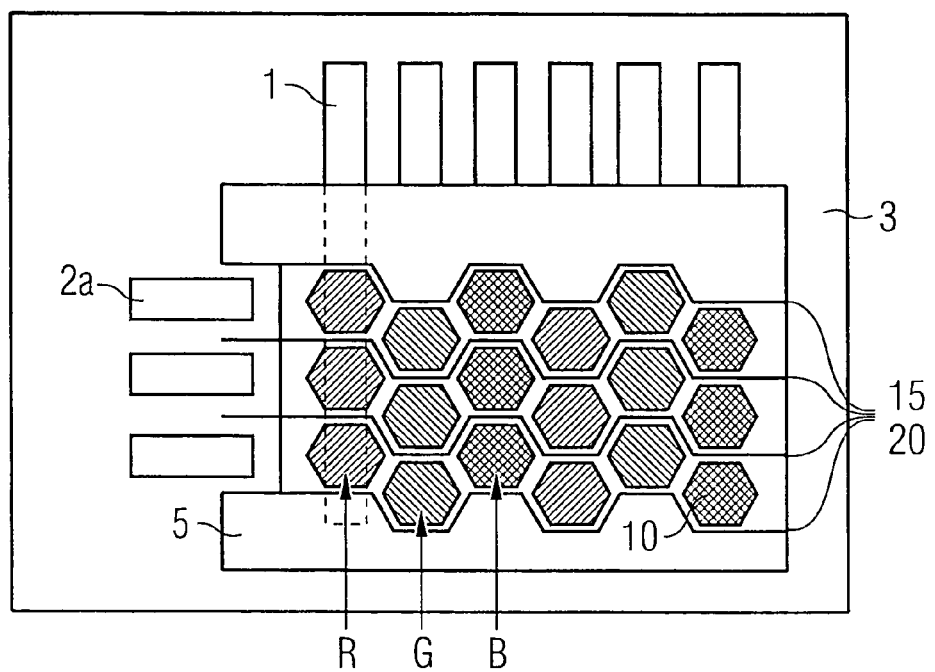

ORGANIC ELECTROLUMINESCENT DEVICE AND THE PRODUCTION THEREOF

BACKGROUND

The invention concerns a display based on the principle of electroluminescent polymers with a structured matrix of pixels and a structured second electrode as well as the manufacture thereof.

The graphic illustration of information continues to make strides in our every day lives. Increasingly more objects of daily use are equipped with display elements which enable an immediate retrieval of information required on-site. In addition to the conventional cathode ray tube ("Cathode Ray Tube, CRT"), that delivers a high picture resolution, but which has the disadvantage of heavy weight and high power consumption, the technology of flat panel displays ("Flat Panel Displays, FPD's) was specifically developed for use in mobile electronic devices.

The mobility of the devices places a high demand on the display to be placed in operation. The low weight—which throws the CRT's out of the race from the beginning—should here initially be mentioned. The small structural depth is another essential criterion. Many devices require a display structural depth of even less than one millimeter.

Only low power consumption is required for displays based on the limited capacity of batteries or chargers in mobile devices. Excellent legibility is another criterion, even at great angles between the display surface and the observer, as well as legibility under various ambient light conditions. The capacity to also display multicolored or fully colored information is increasingly gaining in importance. And last but not least, of course, the service life of the components is an important pre-requisite for the use in the various systems. The importance of the individual requirement criteria of the displays always varies in significance in regard to the application scopes.

Several technologies, all of which will not be discussed here, have been established on the market of flat screen displays over a longer period of time. So-called liquid crystal displays (LC displays) are generally dominant today. Despite low-cost manufacturing, low electrical power consumption, light weight and small space requirement, the technology of the LCDs, however, also has serious disadvantages. LC-displays are not self-emitting and are only readable or recognizable under very favorable ambient light conditions. In most cases, this requires background lighting, which multiplies the thickness of the flat screen display. Consequently, the major share of the electrical power consumption is used for lighting and a higher voltage is required for the operation of the lights or the fluorescent tubes. This is generally produced using "voltage-up-converters" from batteries or power packs. Additional disadvantages are the greatly inhibited observation angle of simple LCDs, the extensive switching periods of individual pixels, which is typically at several milliseconds, and [the fact that] they are very temperature sensitive. The delayed screen layout, for example, is extremely adverse in transportation use.

In addition to the LCDs, there are other flat screen technologies, such as vacuum fluorescence displays or inorganic thin film electroluminescent displays. These, however, have not yet reached the required technical degree of maturity or are only conditionally usable for application in mobile electronic devices due to higher operating voltages or manufacturing costs. Displays have made a name for themselves since 1987 based on organic light emitting diodes (organic light emitting diodes, OLEDs). These do not have the above-mentioned disadvantages. The necessity of background lighting is omitted due to the self-emissivity that considerably reduces the required space and the electrical power consumption. The response times are within the range of a microsecond, and they are only slightly temperature sensitive which enables their use in video applications. The reading angle is almost 180°. Polarization foils that are required in LC displays are generally omitted so that a greater luminosity of the display elements may be achieved. An additional advantage is the usability of flexible and non-planar substrates as well as the easy and low-cost manufacture.

Two technologies exist in the OLEDs that vary in type and in the processing of organic material. On one hand, low molecular organic material, such as hydroxyquinolene-aluminum-III-salt ($Alq_3$), that is generally raised to the appropriate substrate by thermal evaporation, may be used. Displays based on this technology are already available commercially and are mostly used in automotive electronics at the present. However, since the manufacture of these components is associated with numerous processing steps under high vacuum, this technology holds presents disadvantages based on high investments and maintenance, as well as a relative low turnover.

An OLED technology has therefore been developed since 1990 that applies polymers as the organic material that may be more chemically wet from a solution to the substrate. The vacuum phases required to produce the organic coatings are omitted in this technique. Typical polymers are polyaniline, PEDOT (manufactured by Bayer), Poly(p-phenylene-vinylene), poly(2-methoxy-5-(2'-ethyl)-hexyloxy-p-phenylene-vinylene) or polyalkylfluorene, as well as numerous derivatives thereof.

The coating structure of the organic light emitting diodes is typically as follows: A transparent substrate (such as glass) is extensively coated with a transparent electrode (such as indium-tin-oxide, ITO). Depending on the application, the transparent electrode is structured with the aid of a photolithographic process that later defines the form of the light emitting pixel.

One or more organic coatings, consisting of electroluminescent polymers, oligomers, low molecular compounds (refer to the above) or mixtures thereof are then applied to the substrate. Polymer substances are generally applied from a liquid phase by spreading or spin coating, as well as by various pressure techniques as of late. Low molecular and oligomer substances are generally separated from the gas phase through evaporation or "physical vapor deposition" (PVD). The overall coating thickness may be between 10 nm and 10 μm and is typically between 50 and 200 nm.

A counter-electrode, the cathode, which is generally of a metal, a metal alloy or a thin insulation coating and a thick metal coating, is applied to these organic coatings. The gas vapor separation, through thermal evaporation, electron beam evaporation or sputtering, is generally used again to produce the cathode coatings.

The challenge in the manufacture of structured displays exists specifically in structuring the above-described coating structure so that a matrix of individual controllable and multicolored pixels develops. A lithographic technique is available for the first described phase of the OLED manufacture of the structuring of the ITO anode. ITO is extremely insensitive as opposed to the typical spin coatings and developer fluids and may be etched easily by acids such as HBr. Structures with a resolution of a few micrometers may be produced easily by this method.

Structuring the organic coatings and the metal electrode is essentially more difficult. The reason is the sensitivity of the organic material that would be extensively damaged by the subsequent application of aggressive developer fluids or solvents.

The individual functional coatings in OLEDs, based on vaporizable low molecular coatings, may be vaporized on the substrate through a shadow mask so that red, green and blue pixel sections develop. Vaporizing through a shadow mask technique is also available for the striped structuring of the metal cathode (vertical toward the underlying ITO-stripes). This, however, has considerable disadvantages in practical use because of low resolution and the adjustment of the masks over the substrate.

The method of the insulating partitions was therefore developed for this. A series of insulating partitions with a sharp tear-off edge is applied to the substrates directly after structuring the ITO anode. The metal cathode is extensively vaporized after depositing organic coatings (meaning without the use of a shadow mask), whereby the metal film always tears off on the sharp edges of the partitions. This is how separated insulated metal strips (lines) are developed vertically toward the underlying ITO anodes (columns). If a voltage is applied to a particular ITO anode column and a metal cathode line, the organic emitter coating is illuminated at the crossing point between the line and the column. These partitions may have various cross-sections.

Structuring the individual pixels is considerably more difficult for OLEDs based on conjugated polymers that are used up from the liquid phase. Conventional techniques, such as spin coating or spreading, distribute the polymer solution evenly over the entire substrate. A fragmentation into red, green and blue sections with a small structural width, in the event of a color display, is only possible with difficulty, except through subsequent structuring with the assistance of aggressive lithographic methods that considerably damage the polymers.

Several printing techniques have been successfully applied in the past for the structured application of polymers based on this reason. One technique, which has been especially reliable here, is ink jet printing, as well as several versions thereof. However, greater difficulty exists even in these printing techniques to prevent individual adjacent color sections from running into each other. This problem has been circumvented in the past through several solution batches.

European patent 0 892 028 A2 describes a process in which a coating of an insulating material is initially applied onto the ITO-substrate into which windows are inserted in those areas in which the pixels should later be located. This insulating material may, for example, be spin coating that is so modified that it is not moistened by them. The individual drops of the solution (red, green, blue) are also encapsulated at the appropriate points without running into each other and may therefore dry there separately and produce the polymer coating.

This process, however, does not solve the problem of structuring the cathode strips that must be applied onto the polymer as functional coating for passive matrix powered displays. Various technologies have therefore been developed in the past for structuring the cathodes of passive matrix displays. Partitions that are initially applied to the structured ITO substrate were developed in a special process for monochrome displays. The polymer solutions (generally a carrier polymer in a polar solution, followed by an emitter polymer in a polar solution) are spin coated successively onto these substrates. The cathode is then extensively vaporized as a final coating, which tears off from the sharp tear-off edges of the partitions and therefore forms separated cathode strips. This process, however, is initially only suitable for an extensive application and therefore is not suited for full color displays.

An additional coating of the insulating material with "windows" (see above) may be applied as further development of the method of partitions for fully colored displays produced with an ink jet printing process. The insulating windows and partitions are applied to the substrate after applying individual polymer coatings in the process described in European patent 0 951 073 A2. This is again subject to the problems of a treatment of the sensitive conjugated polymers with aggressive developer material, solvents and UV light.

A process is described in patent EP 0 732 868 A2 in which a lithographic treatment of the functional coatings is avoided and a structured cathode is separated at the same time. The partitions for the cathode separation are produced first and then the functional coatings are vaporized in the vacuum through a shadow mask. The serious problem with this method is that the shadow mask does not directly contact the substrate and/or the electrode located on in, but is deposited on the partitions. This considerably reinforces the above mentioned problem of low resolution in the shadow mask technique by vaporizing the mask.

The problem may be summarized in two points. On one hand, a running together of the different colors must be prevented during the structured application. On the other, a structuring of the second electrode must be possible at the same time in passive matrix powered displays.

SUMMARY OF THE INVENTION

The function of the above invention is to define a passive matrix powered display based on electroluminescent polymers that prevents the above-mentioned problems. This function is solved with a display corresponding with claim 1. An advantageous construction of the display as well as its manufacture is the object of the sub-claims.

A new type of pre-constructed substrate is used in the invention, which enables an easy structuring of the pixels with the assistance of a window coating and the simultaneous structuring of the second electrode using partitions without having to perform aggressive lithography phases to the functional polymers.

A display corresponding to the invention has the following characteristics: parallel running first electrode strips are located on one substrate, a first insulating coating is located on one substrate above the first electrode strip in which windows are arranged above the first electrode strips that surround the functional coatings located therein, at least one additional insulating coating, located between the windows of the first insulating coating is arranged as partition across the first electrode strips, a second electrode that contacts the functional coatings is structured by partitions and runs across to the first electrode strips.

The invention describes a passive matrix-powered display in which an insulating window coating is used to separate the pixels and the partitions, consisting of at least one insulating coating to structure the second electrode (cathode) as compared to the current state of technology. The advantage exists that the coating structure for the windows and the partitions is produced on the substrate prior to the application of the polymer solutions and the cathode. By this method, neither the sensitive polymer coatings nor the cathode metals are exposed to aggressive chemicals or UV light which would be required in subsequent structuring. The polymer solutions, which generally consist of a polar carrier polymer and non-polar emitter polymers, are enclosed in individual pixels mechanically (through the appropriately high coating thickness of the window coating) as well as "chemically" (through passivation, for example, by fluorination or other chemical surface treatments that prevent wetting these surfaces with functional polymers). A blunt angle of the window edges in the window coating assures safe metal plating of the individual pixels without the hazard of tearing off the metal coating. Reliable electrical structuring of the metal cathode is assured by high partitions with a sharp tear-off edge. A surface treatment of the partitions through fluorination (for example, through a $CF_4$ plasma) prevents erosion with polymers that would render any reliable tearing off of the metal coatings on the partitions difficult.

A display according to the invention preferably has the following additional characteristics: electrode connector parts for the second electrode that run across to the first electrode strip and sideways to them, are located on the substrate, windows are located in the first insulating coating above the electrode connector parts or the first insulating coating is structured so that the areas of this coating are located between the electrode connector parts, the second electrode contacts the electrode connector parts, an encapsulation is attached that covers at least the area of the second electrode and the insulating coating and leaves one end of each electrode open.

The additional structured electrode connector parts preferably consist of air and moisture resistant ITO as the first electrode strips. The cathode material itself, which usually consists of sensitive metals, is not exposed to air due to the fact that these cathode connector parts are led through under the encapsulation, which considerably increases the service life of the display. The window coating or recesses in the window coating is intended for the cathode connector parts, in order to assure an overlapping between the metal cathode and the ITO electrode connector parts, so that the partitions do not override any steps at the end of the window coating, but are always located on the base of the window coating. Both versions of the window coating, however, continue to provide contact between the cathode connector parts and the cathode.

A three-coat structure is provided on the substrate of another version of the display, in which a second and third insulating coating may be located above the first insulating coating as striped partitions across toward the first electrode strips, in which the first and third insulating coating may consist of the same material, preferably of a positive surface imaging resist, and in which the second insulating coating may consist of polyimide.

The three coating structure has partitions with two coatings to structure the pixels in addition to the window coating. Due to the two layered structure, these partitions may project extremely sharp tear-off edges which may later assure an especially dependable tearing and an insulation of the cathode strips when applying the metal coatings. A version in which the window coating, as well as the cap of the insulating partitions, consists of the same photo structure material that is realized by the third insulating coating, has additional advantages. In manufacturing, only two instead of three insulating materials have to be processed, which results in cost savings for materials, developers and solvents. The windows and the caps of the partitions act identical chemically, meaning they are stable in comparison to the same solvent and cleaning procedures. This is of a great technical processing advantage. The windows and caps of the partitions may be passivated through the same phase for wetting purposes. For example, through plasma treatment.

Alternative versions of the windows for the pixels are subjects of additional claims: the windows located in the first insulating coating are rectangular, or the windows of the first insulating coating are rectangular with rounded corners, or the windows are hexagonal and the first electrode strips in the area of the windows follow the outline of the windows and the partitions are arranged angular around the hexagons.

The advantages of the various window forms will be explained briefly in the following. For rectangular pixels, a greater share of the active surface is possible on the overall surface of the pixels than in round pixels. Better wetting of the ITO surface within the pixels is possible by rounding the corners in the rectangular pixels. Hexagonal pixels are easier to fill with the support of a micro-dosing process (meaning, filling with generally round drops) than rectangles. On the one hand, hexagons have the advantage over round pixels because they allow a greater share of the active surface of the overall surface of the display. The main focus of the appropriate red, green and blue pixels is closer together than in the case of round pixels in color displays with this arrangement (refer to FIG. 8), which improves the color image when viewing the display. The partitions in the case of hexagonal pixels are lead around the pixels at an angle (refer to FIG. 8).

The process to manufacture the display according to the invention (refer to FIGS. 9A to 9G) essentially rests therein that the window coating is initially structured to encapsulate the pixels and then the partitions to separate the cathode strips are structured on the substrate, and only then are the functional coatings applied to the windows so that no lithographic processes have to be performed on the sensitive polymer coatings. For a three coating structure, the first insulating window coating is applied to the second and third insulating coating after structuring. Then the third insulating coating is structured with the aid of a shadow mask and a photolithographic process. This coating then serves as a mask for the structuring of the second coating which is the base for the partitions. The invention will be explained subsequently in more detail through several design examples combined with drawings. The figures serve only for a better understanding of the invention and are therefore schematically simplified and are not according to scale.

BRIEF DESCRIPTION OF THE DRAWINGS

FIG. 7 shows the cross-section through the structure of the display corresponding with the invention.

FIG. 8 shows the arrangement of the pixels and the partitions for hexagonal pixels.

DETAILED DESCRIPTION

Figure 1:
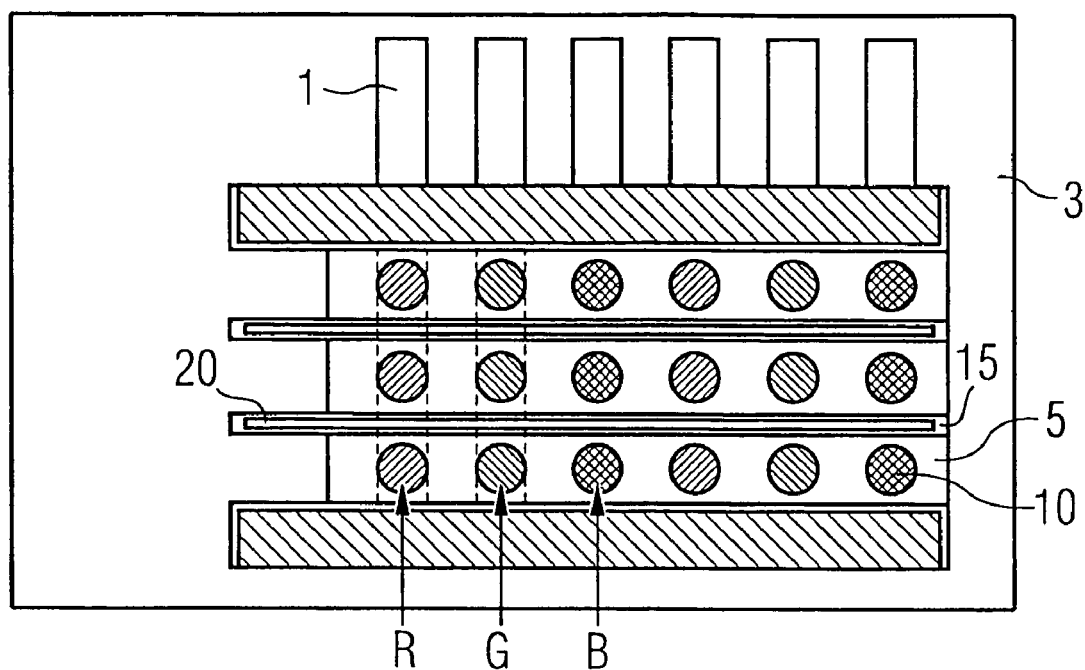
FIG. 1 shows the 3-coating structure according to the invention on a substrate with window coating, bases of the partitions and caps of the partitions.

FIG. 1 shows a view of the structure of a display made applying the invention, whereby the pixels of various colors R, G and B are located in the windows 10 of window coating 5 above the electrode strips 1 of a color display. The partitions for the cathode separation run between the pixels. In the event of a two-coating structure, they consist of the bases 15 and the caps 20. Alternatively, single-layer or more than two layer arrangements are also possible for the partitions which preferably have overlapping edges on which the metal for the second electrode may tear off. The dotted lines mark an example of the process of an electrode strip 1 below window coating 5.

Figure 2:
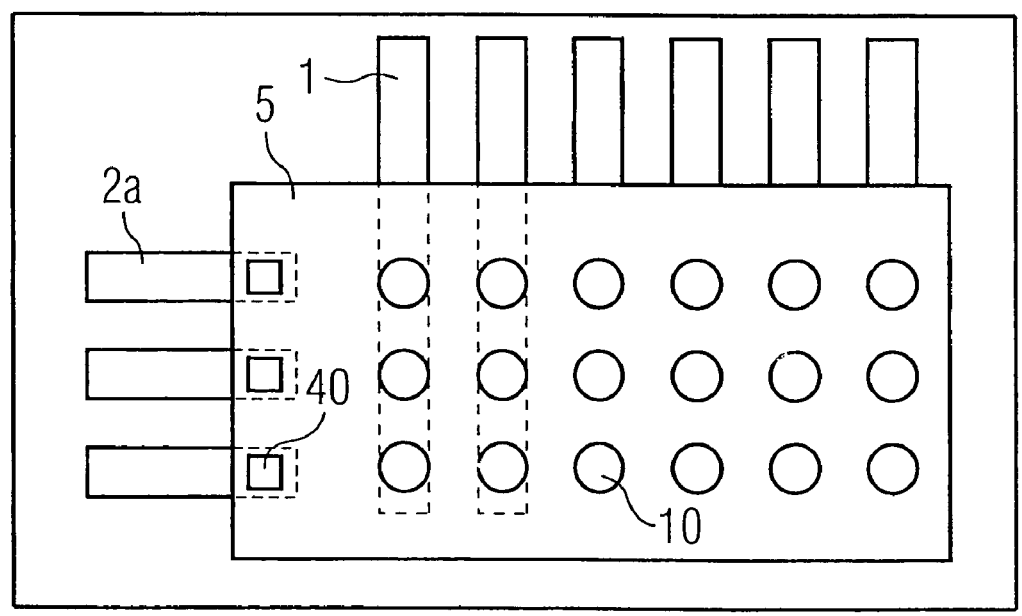
FIG. 2 shows the openings in the window coating above the first electrode strip and the first electrode connector parts.

FIG. 2 shows round pixels 10 in window coating 5 above the first electrode strips. In addition, there are more windows 40 above the electrode connector parts 2a in the window coating.

Figure 3:
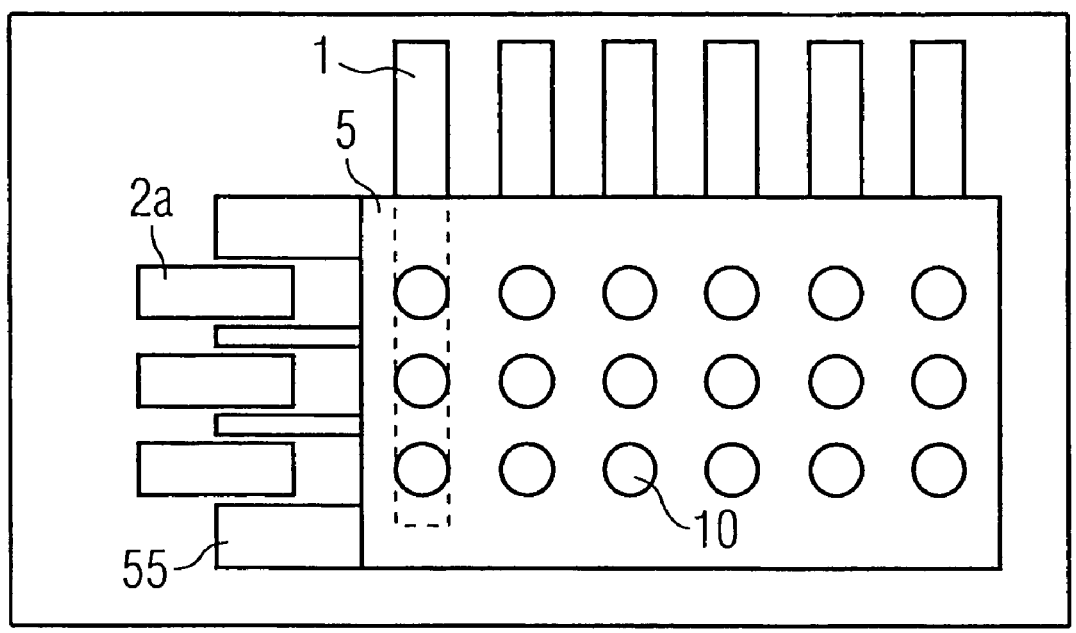
FIG. 3 shows the expansions of the first insulating coating located between the electrode connector parts.

FIG. 3 shows an alternative to FIG. 2, expansions 55 in the window coating 5, which are located between the electrode connector parts 2a and which allow a continuance of the partitions between the electrode connector parts.

Figure 4:
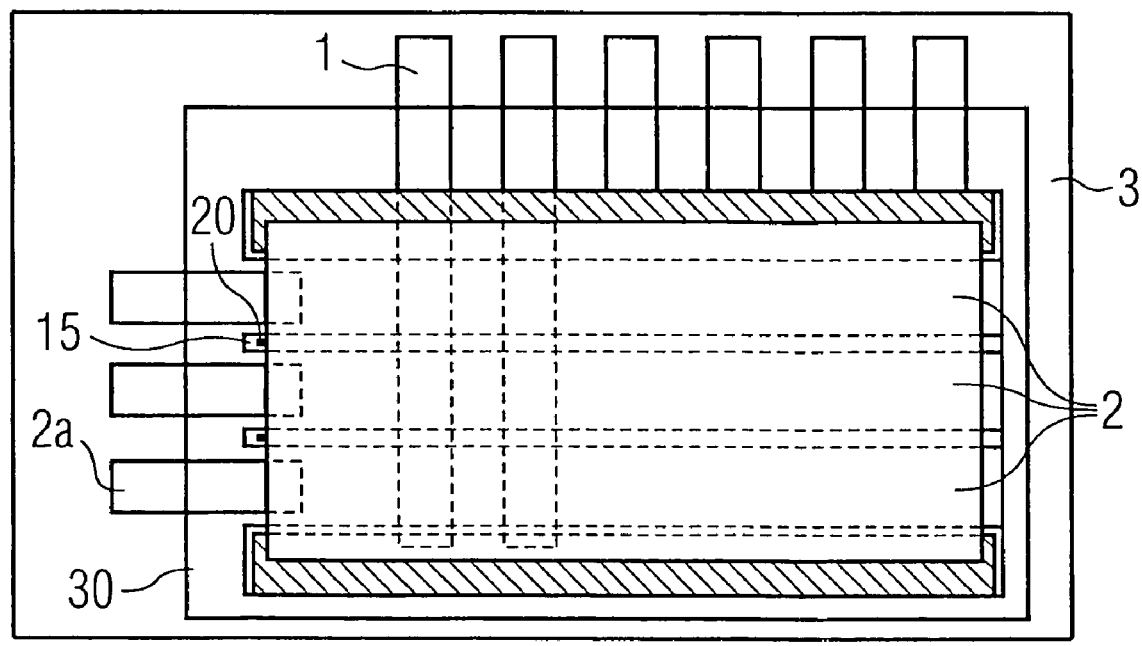
FIG. 4 shows the complete structure of the display corresponding with the invention with the attached cathodes and the encapsulation.

FIG. 4 shows the complete structure of a display made applying the invention on substrate 1 with attached second electrodes 2 and an encapsulation 30, which always keeps one end of each first electrode strip and one end of each electrode connector piece 2a for the cathode 2 unencapsulated.

Figure 5:
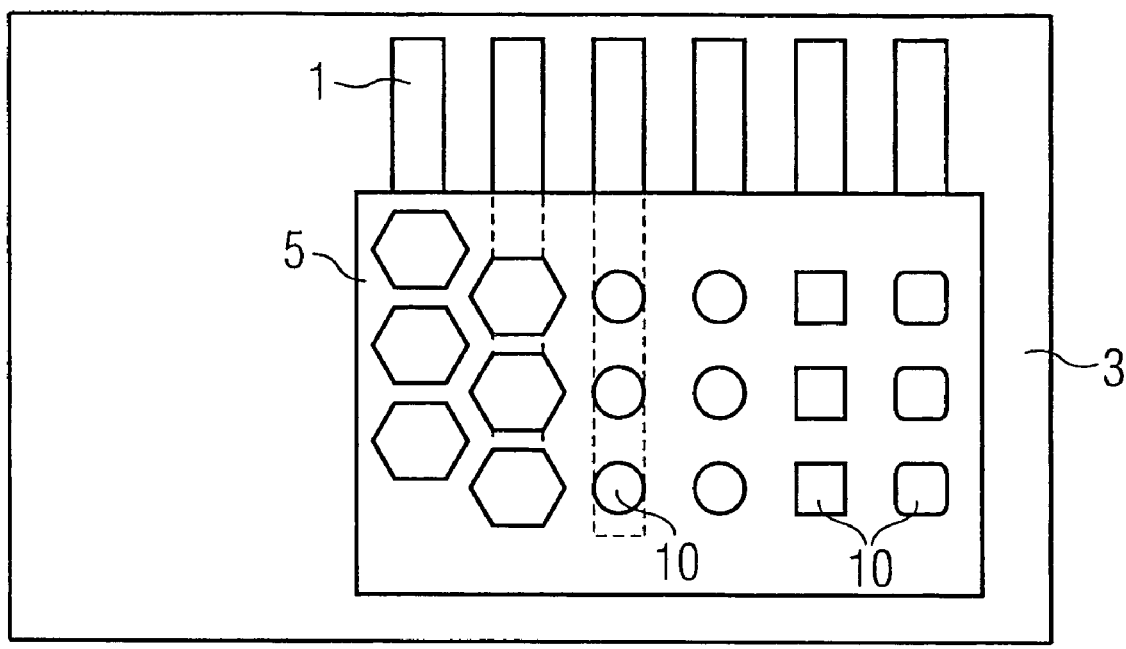
FIG. 5 shows various design possibilities of the windows in the first insulating coating above the first electrode strip.

FIG. 5 shows various design possibilities for the windows 10 in the first insulating coating 5. The different windows are only illustrated next to each other in one display for simplicity's sake. Hexagonal pixels, round pixels, rectangular pixels with rounded corners are shown.

Figure 6:
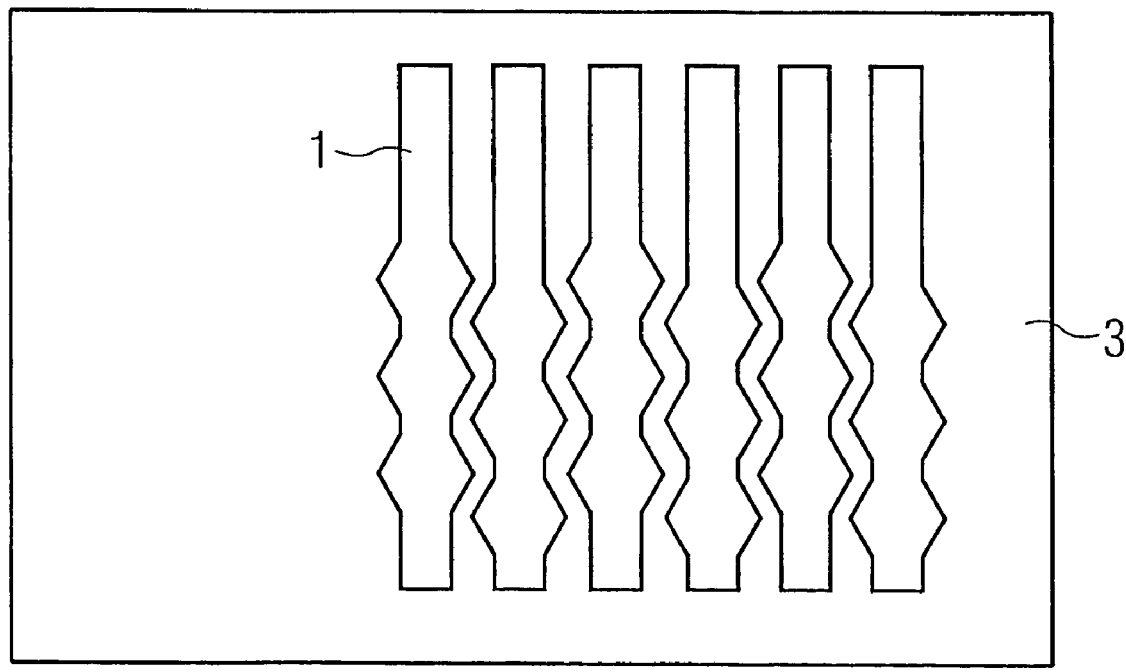
FIG. 6 shows the design of the first electrode strips in the event of hexagonal pixels.

FIG. 6 shows the design of the first electrode strips for hexagonal pixels. It illustrates that the first electrode strips follow their outline in the area of the pixels which are located above.

FIG. 7 shows a cross-section through the design of a display made applying the invention. A three-layer design possibility is seen, in which the bases 15 and the caps 20 of the partitions are structured on the insulating window coating 5. Pixels, which always contact the first electrode 1 and the second electrode 2, are located in the windows of the window coating. The pixels consist generally of a perforated carrier polymer 12 and an emitter polymer 14. A metal coating 2b, which is formed during the application of the electrode material for the second electrode by tearing off at the edges of the partitions, is located on the caps of the partitions and does not contact the functional coatings.

FIG. 8 shows the arrangement of the pixels and the partitions for hexagonal pixels. It illustrates that the different sub-pixels may be arranged much tighter in a color display R, G and B, so that a higher filling factor is possible for the display. The partitions (in a two-layer structure 15 and 20) are lead around the pixels at an angle.

Figure 9A:
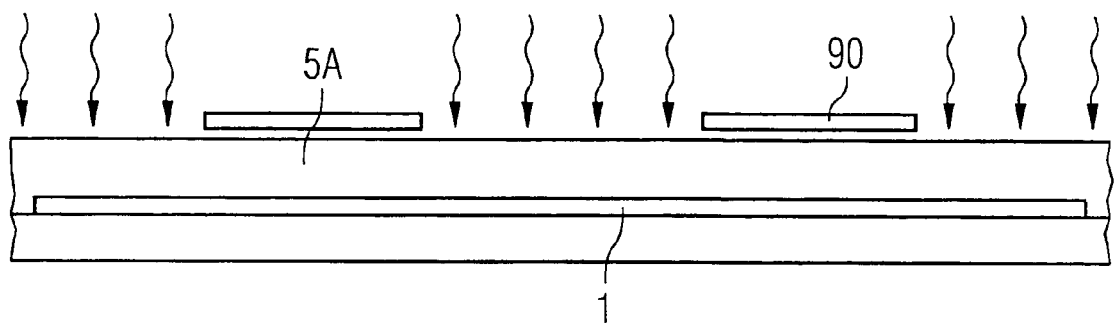
FIGS. 9A through G show the invented displays during various stages of the manufacturing process, each related to cross-sections of the structure of a substrate.
Figure 9B:
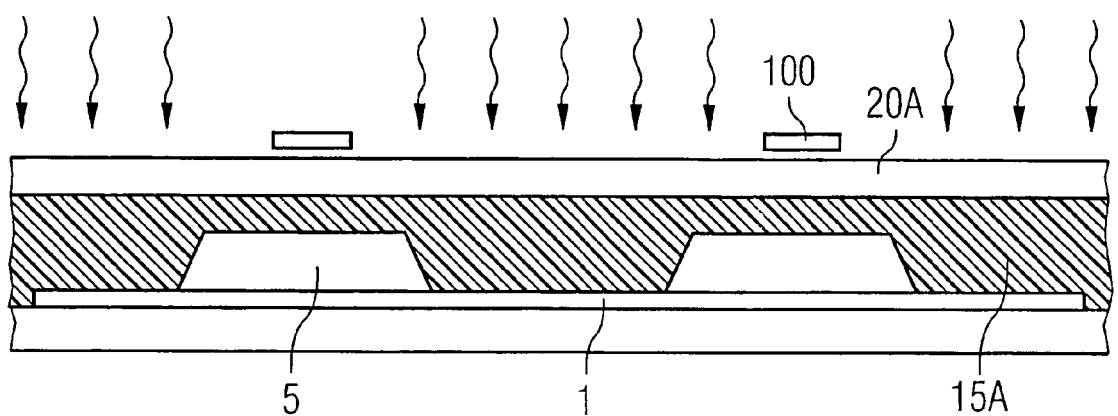

FIG. 9A illustrates the photolithographic structuring of the first insulating coating consisting of spin coating, in this case, with the support of a shadow mask 90, so that the window coating 5 is formed. The caps 20 of the partitions are defined through illumination with the support of a shadow mask 100 in FIG. 9B following the application of non-photo-configurable coating 15A (for example, polyimide) and the third insulating coating 20A (for example, a surface imaging resist) and are developed with developer.

Figure 9C:
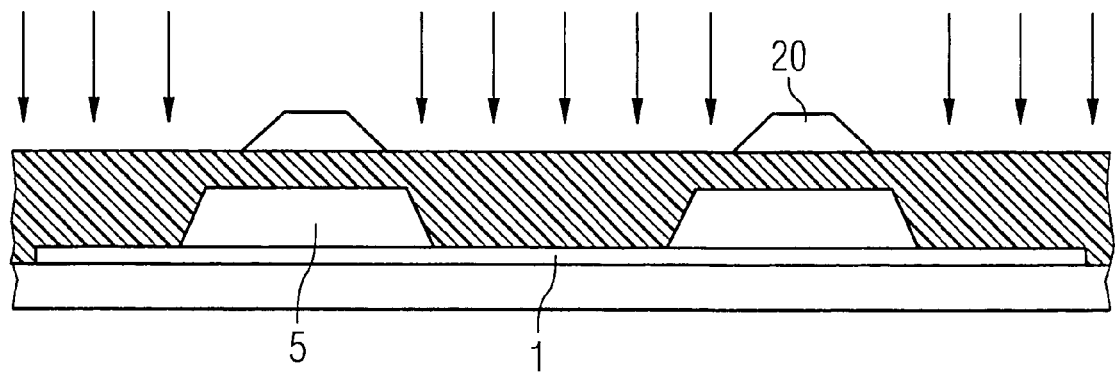

FIG. 9C shows the structuring of the bases of the partitions through a solvent that selectively affects coating 15A. The already formed caps 20 serve as mask for structuring the bases.

Figure 9D:
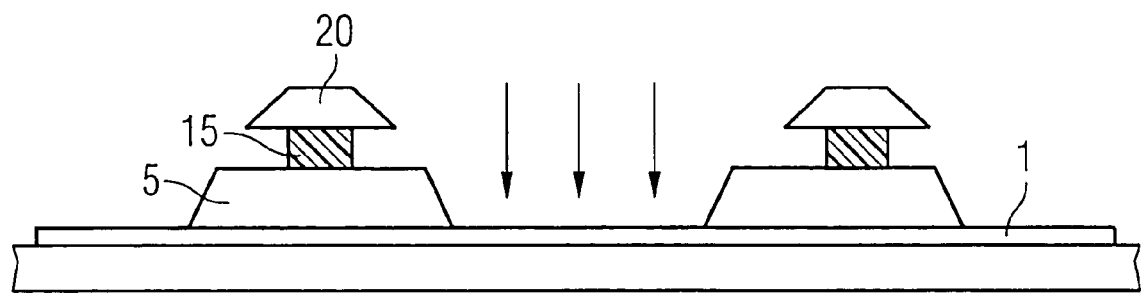

The functional polymers are inserted into the windows in FIG. 9D after completion of structuring the three coating structure 5, 15, 20.

Figure 9E:
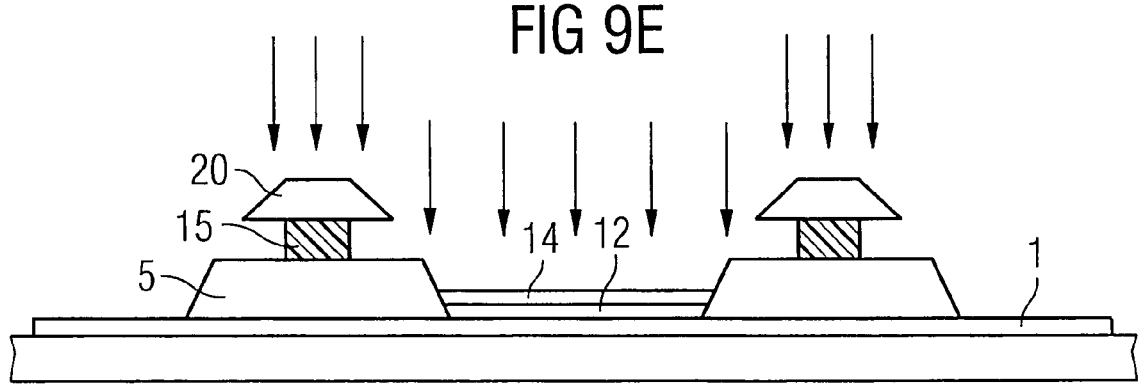

FIG. 9E shows the extensive vaporization of the second electrode whereby this is achieved by tearing off the metal film at the edges of the partitions.

Figure 9F:
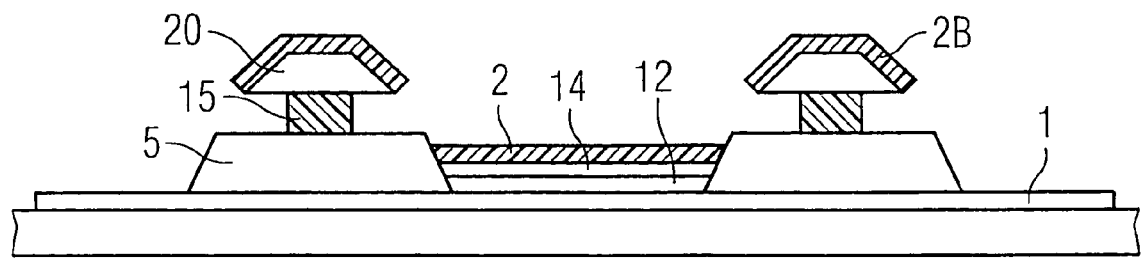

FIG. 9F shows the assembly of a display made applying the invention after the application of the second electrode 2. A sample of a pixel can be seen in a window of window coating 5 that consists of functional polymers 12 and 14, which are contacted on one side by the first electrode and on the other side by the second electrode. On the caps 20 of the partitions are non-functional metal strips 2b that are formed on the edges of the partitions by the metal film tearing off of the second electrode.

Figure 9G:
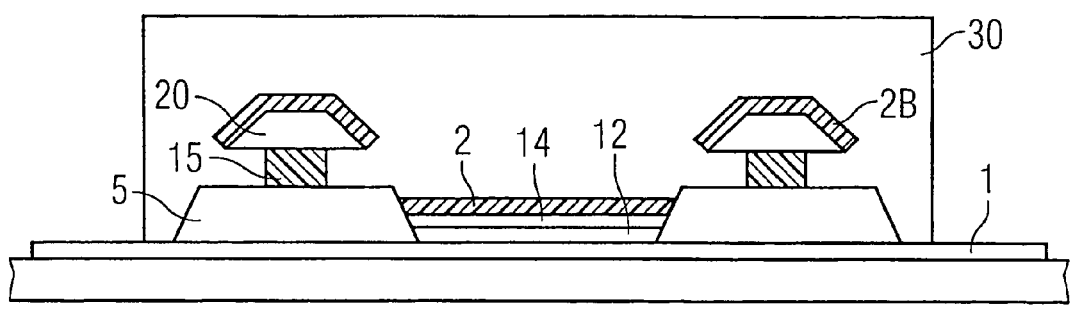

FIG. 9G shows the encapsulation 30 above the entire assembly. The invention enables the simultaneous definition of the pixels by structuring window coating 5 and structuring a second electrode through the partitions that consist of bases 15 and caps 20 in the two-coat version, which are located on the window coating.

EXAMPLE 1

The manufacture of a passive matrix-powered display with a double-coated partition is achieved as follows:

1. A large surface glass substrate 3 coated with ITO is structured through a state of the art lithographic process in combination with a corrosive process using 30% HBr solution so that the electrode strips 1 develop.

2. A positive surface imaging resist is subsequently spun onto the substrate and pre-heated on a hot plate. The spinning parameters are selected so that a coating with a thickness of approximately 6 µm develops. Window structures 10 are produced in coating 5 (see FIG. 9A) by illuminating with a suitable mask and by developing (for example, in developer AZ 726 MIF, manufactured by Clariant). The windows for the pixels are structured so that the insulating coating does not have any sharp edges with pointed angles (<90°). This is necessary since the subsequently applied metal coating may not tear off from the edges of these windows, which would prevent contact by the individual OLED pixels. A positive surface imaging resist is preferably applied as material for window coating 5.

3. The thus pre-treated substrates are subjected to a heating phase in a vacuum oven, which makes the surface imaging resist resistant against the subsequent lithography phases.

4. A coating of a second insulating material, preferably a polyimide, is subsequently spun widely onto the substrate, followed by a brief heating, for example, on a hot plate.

5. An additional coating of the first or one of the various surface-imaging resists is then extensively spun onto this polyimide and is briefly heated on the hot plate. By illuminating with a suitable mask 100 and subsequent developing with the same developer fluid as described above, this coating is finally formed into a striped structure to the caps of the partitions 20 (see FIG. 9B). A subsequent heating phase increases the stability of these strips.

6. The cap of the partitions thus produced now serves as a mask for the lithographically non-structurable polyimide coating underneath. By interacting with a solvent, which only affects the polyimide coating, this is then also structured in strips toward the bases 15 of the partitions so that partitions with the cross-section illustrated in FIG. 7 are formed (also refer to FIGS. 9C and 9D). The use of the same surface imaging resists for window coating 5 and the caps of the partitions 20 simplifies production, since only two different materials instead of three must be used for the window coating and the partitions.

7. The pre-structured substrates are subjected to several cleaning phases through treatment with solvents and/or plasma effects (for example, through $CF_4$-plasma).

8. By using a micro-dosing system (for example, an ink jet printer), an appropriate amount of the perforated carrier polymer solution is added into each window. Following a suitable drying period, the solutions of the emitter polymer are then applied into the windows between the partitions (see FIG. 9D). The deep windows in combination with the partitions, as well as the surface treatment and fluorination using several plasmas, offer an excellent mechanical as well as a "chemical" barrier (by preventing wetting) through which the solutions are encapsulated in the windows. Short circuits between the metal cathode, via the carrier polymer, and the ITO may be prevented by this method, as well as short circuits between neighboring cathode tracks, which would occur through eroding the partitions.

9. Then, a coating of the base metal, for example, calcium, followed by a coating of a stable or precious metal, such as aluminum or silver, is vaporized so that the second electrode is formed by tearing the metal film at the edges of the partitions (refer to FIGS. 9E and 9F).

10. Then, the component of the sample is equipped with a metal or glass cap 30 and is, for example, encapsulated using a UV hardened epoxy adhesive (see FIG. 9G).

EXAMPLE 2

Manufacture of a Display with Electrode Connector Parts

1. A glass substrate 3, extensively coated with ITO, is structured in a state of the art lithographic process in combination with a corrosion process using 30 percent HBr solution, so that the first electrode strips 1 and the electrode connector parts 2a are formed (see FIG. 2, 3 or 4).

2. Then, a positive surface imaging resist is spun onto the substrate and is heated on a hot plate. The spinning parameters are selected so that a coating with a thickness of approximately 6 µm develops. Window structures 10 are produced above the first electrode strip by illuminating with a suitable mask and, for example, by developing with developer AZ 726 MIF, manufactured by Clariant, and they are also structured with the surface imaging resist in the area of the electrode connector parts so that either the offshoots 55 between the connections or the windows 40 are formed above the connections.

3. Additional steps follow as in example 1, whereby the encapsulation 30, only covers one end of each of the electrode connections (see FIG. 4).

EXAMPLE 3

Manufacture of a Display with Pixels of Various Outlines

1. Step 1 of example 1

2. A positive surface imaging resist is subsequently spun onto the substrate and is pre-heated on a hot plate. The spinning parameters are selected so that a coating with a thickness of approximately 6 µm is produced. Window structures with an appropriate outline according to FIG. 5 (except hexagons) are produced by illuminating with suitable masks and developing (for example, in developer AZ 726 MIF, manufactured by Clariant). For example, pixels with rectangular outlines with rounded corners and round pixels may be produced.

3. The next steps are performed in accordance with example 1.

EXAMPLE 4

Manufacture of a Display with Hexagonal Pixels

1. A glass substrate 3, extensively coated with ITO, is structured in a state of the art lithographic process combined with a corrosive process using 30 percent HBr solution so that the first electrode strips 1 are formed, and these follow the outline of the hexagonal pixels in the area of the future pixels 10 (see FIG. 6).

2. A positive surface resist is then spun onto the substrate and pre-heated on a hot plate. The spinning parameters are selected following step 2 in example 1. The window structures 10 are produced above the first electrode strips by illuminating with a suitable hexagonal mask.

3. The next steps are performed in accordance with example 1, whereby a modified lithography mask is used so that the partitions are led around the hexagonal pixels at an angle (see FIG. 8).

The invention claimed is:

1. An organic electroluminescent device, comprising:
   parallel first electrode strips on a substrate;
   a first insulating coating on the substrate and the first electrode strips, the first insulating coating having first windows located over the first electrode strips;
   a functional coating in at least one of the first windows;
   a second insulating coating structured to form strip-shaped partitions between the first windows and extending across the first electrode strips on the first insulating coating;
   second electrode strips contacting the functional coating and extending across the first electrode strips;
   electrode connectors extending toward the first electrode strips on the substrate; and
   an encapsulation covering the first and second insulating coatings and leaving one end of each electrode connector not encapsulated; wherein
   the first insulating coating has second windows over the electrode connectors such that the second windows are surrounded by the first insulating coating; and
   the second electrode strips contact the electrode connectors.

2. The device of claim 1, wherein the first insulating coating has areas between at least two of the electrode connectors.

3. The device of claim 1, further comprising:
   a third insulating coating structured to provide strip-shaped partitions on the first insulating coating.

4. The device of claim 3, wherein:
   the first and third insulating coatings include a positive surface imaging resist.

5. The device of claim 1, wherein:
   the first insulating coating includes a first material and the second insulating coating includes the first material.

6. The device of claim 1, wherein:
   the second insulating coating includes a polyimide.

7. The device of claim 1, wherein:
   the first windows are rectangular.

8. The device of claim 1, wherein:
   the first windows are rectangular with rounded corners.

9. The device of claim 1, wherein:
   the first windows are hexagonal;
   the first electrode strips have a perimeter and a portion of the perimeter of the first electrode strips follows a portion of a perimeter of the hexagonal first windows; and the second insulating coating is arranged along a crooked path between the hexagonal first windows.

10. The device of claim 9, further comprising:

a third insulating coating structured to provide strip-shaped partitions on the first insulating coating, wherein the third insulating coating is arranged along a crooked path between the hexagonal first windows.

11. The device of claim 1, wherein:

the first insulating coating and the second insulating coating are passivated with a plasma treatment.

12. The device of claim 1, wherein the functional coating comprises functional polymers.

13. The device of claim 1, wherein the first windows define a location of the functional coating and corresponding pixels.

14. A method of forming an organic electroluminescent device, comprising:

structuring parallel first electrode strips on a substrate;

structuring electrode connectors to extend toward the first electrode strips;

applying a first insulating coating on the substrate;

structuring the first insulating coating to have first windows located over the first electrode strips and second windows over the electrode connectors, wherein the second windows are surrounded by the first insulating coating;

applying and structuring a second insulating coating and a third insulating coating on the first insulating coating to form strip-shaped partitions extending between the windows and across the first electrode strips;

applying a functional coating in at least one of the windows; and applying and structuring a second electrode such that the second electrode contacts the functional coating and the electrode connectors, wherein the second electrode is structured into strips by the structured second and third insulating coatings.

15. The method of claim 14, wherein areas of the first insulating coating extend between at least two of the electrode connectors and the second electrode strips connect the electrode connectors and the functional coating, the method further comprising encapsulating the first second and third insulating coatings, the second electrode strips and the electrode connectors such that one end of each of the electrode connects is not encapsulated.

16. The method of claim 14, further comprising:

passivating the second and third insulating coatings after structuring.

17. The method of claim 16, wherein:

passivating the second and third insulating coatings includes plasma treatment.

18. The method of claim 14, wherein:

structuring the first insulating coating includes forming rectangular windows.

19. The method of claim 14, wherein:

structuring the first insulating coating includes forming rectangular windows with rounded corners.

20. The method of claim 14, wherein:

structuring the first insulating coating includes forming hexagonal windows.

21. The method of claim 20, wherein:

applying and structuring the second insulating coating and the third insulating coating includes forming partitions that extend across the first electrode strips and along crooked paths between the hexagonal windows.

22. The method of claim 21, wherein:

applying and structuring the second electrode strips includes forming the second electrode strips to have a perimeter and a portion of the perimeter of the first electrode strips follows a portion of a perimeter of the hexagonal windows.

23. An organic electroluminescent device, comprising:

parallel first electrode strips on a substrate;

a first insulating coating on the substrate and the first electrode strips, the first insulating coating having hexagonal windows located over the first electrode strips;

a functional coating in at least one of the first windows; and a second insulating coating structured to form strip-shaped partitions between the hexagonal windows and extending across the first electrode strips on the first insulating coating; wherein the first electrode strips have a perimeter and a portion of the perimeter of the first electrode strips following a portion of a perimeter of the hexagonal windows, and the second insulating coating is arranged along a crooked path between the hexagonal windows.

24. A method of forming an organic electroluminescent device, comprising:

structuring parallel first electrode strips on a substrate;

applying a first insulating coating on the substrate;

structuring the first insulating coating to have hexagonal windows located over the first electrode strips;

applying and structuring a second insulating coating and a third insulating coating on the first insulating coating to form strip-shaped partitions extending between the windows and across the first electrode strips;

applying a functional coating in at least one of the windows; and applying and structuring a second electrode such that the second electrode contacts the functional coating and is structured into strips by the structured second and third insulating coatings.

* * * * *

UNITED STATES PATENT AND TRADEMARK OFFICE
CERTIFICATE OF CORRECTION

PATENT NO. : 7,417,371 B2
APPLICATION NO. : 10/483520
DATED : August 26, 2008
INVENTOR(S) : Jan Birnstock et al.

It is certified that error appears in the above-identified patent and that said Letters Patent is hereby corrected as shown below:

Column 11, Line 42 at Claim 15; replace:
"ther comprising encapsulating the first second and third insu-" with
-- ther comprising encapsulating the first, second and third insu- --

Column 12, Line 33 at Claim 23; replace:
"portion of a perimeter of the hexagonial windows, and-" with
-- portion of a perimeter of the hexagonial windows; and --

Signed and Sealed this

Sixteenth Day of December, 2008

JON W. DUDAS
*Director of the United States Patent and Trademark Office*